United States Patent
Inamiya et al.

(10) Patent No.: US 9,287,429 B2
(45) Date of Patent: *Mar. 15, 2016

(54) SOLAR CELL SEALING FILM AND SOLAR CELL USING THE SAME

(71) Applicant: BRIDGESTONE CORPORATION, Chuo-ku, Tokyo (JP)

(72) Inventors: Takato Inamiya, Yokohama (JP); Hisataka Kataoka, Yokohama (JP); Norihiko Kaga, Yokohama (JP); Yasunori Tarutani, Yokohama (JP)

(73) Assignee: BRIDGESTONE CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/374,963

(22) PCT Filed: Jan. 25, 2013

(86) PCT No.: PCT/JP2013/051577
§ 371 (c)(1),
(2) Date: Jul. 28, 2014

(87) PCT Pub. No.: WO2013/111851
PCT Pub. Date: Aug. 1, 2013

(65) Prior Publication Data
US 2015/0007888 A1    Jan. 8, 2015

(30) Foreign Application Priority Data

Jan. 27, 2012 (JP) ................................. 2012-015246

(51) Int. Cl.
| | |
|---|---|
| C08L 23/08 | (2006.01) |
| H01L 31/048 | (2014.01) |
| C08L 23/06 | (2006.01) |
| C08J 5/18 | (2006.01) |
| C08L 23/04 | (2006.01) |
| C08L 31/04 | (2006.01) |
| C08K 5/14 | (2006.01) |

(52) U.S. Cl.
CPC .............. *H01L 31/0481* (2013.01); *C08J 5/18* (2013.01); *C08L 23/04* (2013.01); *C08L 23/06* (2013.01); *C08L 23/0853* (2013.01); *C08L 31/04* (2013.01); *C08K 5/14* (2013.01); *C08L 23/08* (2013.01); *C08L 2203/204* (2013.01); *C08L 2207/066* (2013.01)

(58) Field of Classification Search
CPC ............ C08J 5/18; C08L 31/04; C08L 23/06; C08L 23/0853; C08L 23/04; C08L 31/0481; C08L 2207/066; C08L 2203/204; C08K 5/14
USPC .......................................... 136/259; 525/222
See application file for complete search history.

(56) References Cited

U.S. PATENT DOCUMENTS

| | | | |
|---|---|---|---|
| 2011/0045287 A1* | 2/2011 | Kawashima et al. | 428/345 |
| 2014/0366945 A1* | 12/2014 | Inamiya et al. | 136/259 |
| 2015/0038646 A1* | 2/2015 | Tarutani et al. | 525/222 |

FOREIGN PATENT DOCUMENTS

| | | |
|---|---|---|
| JP | 2001-332750 A | 11/2001 |
| JP | 2002-235048 A | 8/2002 |
| JP | 2005-126708 A | 5/2005 |
| JP | 2008-258255 A | 10/2008 |
| JP | 2010-059277 A | 3/2010 |
| JP | 2011-153286 A | 8/2011 |
| WO | 2012/002264 A1 | 1/2012 |

OTHER PUBLICATIONS

International Search Report for PCT/JP2013/051577 dated Feb. 26, 2013.

* cited by examiner

*Primary Examiner* — Nathan M Nutter
(74) *Attorney, Agent, or Firm* — Sughrue Mion, PLLC

(57) ABSTRACT

The present invention provides a solar cell sealing film in which the shrinkage is prevented when heated. The solar cell sealing film 13A, 13B comprises a resin mixture of an ethylene-vinyl acetate copolymer and polyethylene, and an organic peroxide. The mass ratio (EVA:PE) of the ethylene-vinyl acetate copolymer (EVA) to the polyethylene (PE) is 8:2 to 3:7 and the melting point of the resin mixture (temperature at a viscosity of 30,000 Pa·s) is 80 to 105° C.

6 Claims, 1 Drawing Sheet

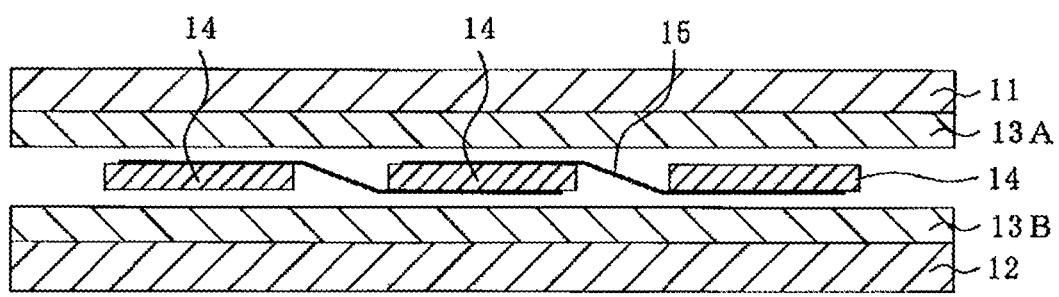

SOLAR CELL SEALING FILM AND SOLAR CELL USING THE SAME

CROSS REFERENCE TO RELATED APPLICATIONS

This application is a National Stage of International Application No. PCT/JP2013/051577 filed Jan. 25, 2013, claiming priority based on Japanese Patent Application No. 2012-015246 filed Jan. 27, 2012, the contents of all of which are incorporated herein by reference in their entirety.

TECHNICAL FIELD

The present invention relates to a solar cell sealing film for a solar cell, especially relates to a solar cell sealing film which can be prevented from shrinking when heated.

BACKGROUND ART

In recent years, a solar cell has been widely employed as a device directly converting solar energy into electric energy from the viewpoints of effective use of natural resources and prevention of environmental pollution. Further developments of solar cells are in progress with the object of power generation efficiency and durability.

As shown in FIG. 1, for example, a structure of the solar cell is known in which a light receiving side transparent protection material 11 such as a glass substrate, a light receiving side sealing film 13A, a photovoltaic elements 14 such as crystalline silicon cells, a backside sealing film 13B and a backside protection material (back cover) 12 are laminated in this order and are adhesively combined each other.

In order to generate a large electrical output, a solar cell has plural photovoltaic elements 14 connected to each other by using a connecting tab(s) 15. Therefore, photovoltaic elements are sealed by using insulating sealing films 13A, 13B so as to maintain insulation property of photovoltaic elements 14.

In the related art, as a sealing film for such solar cells, a film made of ethylene-polar monomer copolymer such as ethylene-vinyl acetate copolymer (occasionally abbreviated to EVA) or ethylene-ethyl acrylate copolymer (EEA) is used. Especially, the EVA film is preferably used because it has low cost and high transparency. Furthermore, in the EVA film used for the sealing film, a crosslinker such as an organic peroxide other than EVA is used to improve crosslink density and thus the durability and strength of the film are improved.

Moreover, in recent years, several sheets have been developed such as a solar cell sealant seat containing EVA and ethylene-(meth)acrylic acid-acrylic acid copolymer for improving transparency and insulation property (Patent Literature 1), and a sealing film composition or a sealing sheet containing an ethylene base copolymer such as EVA and a polyolefin such as polyethylene for improving heat resistance, creep resistance and steam permeation resistance (Patent Literatures 2 and 3).

Meanwhile, when producing the solar cell by using a sealing film which contains EVA, in general, the light receiving side transparent protection material, light receiving side sealing film, photovoltaic elements, backside sealing film and backside protection material are laminated in this order, are heated and are pressed by a laminator so as to crosslink and cure EVA and finally they are adhesively combined each other.

CITATION LIST

Patent Literatures

Patent Literature 1: Japanese patent publication laid-open No. 2005-126708
Patent Literature 2: Japanese patent publication laid-open No. 2001-332750
Patent Literature 3: Japanese patent publication laid-open No. 2010-59277

SUMMARY OF THE INVENTION

Problem to be Solved by the Invention

However, there is a case that a thermal shrinkage is occurred in the sealing film of the related art when heating in the combining procedure. If the thermal shrinkage is severely occurred, the photovoltaic elements are pulled by the sealing film and thus those elements are overlapped or cracked. As the result, not only do the photovoltaic efficiency and yield of the solar cell become lower, but also the appearance of the solar cell becomes deteriorated.

It is therefore an object of the present invention is to provide a solar cell sealing film in which shrinkage is suppressed when heated.

Another object of the present invention is to provide a solar cell in which one or more photovoltaic elements are sealed by the solar cell sealing film.

Means for Solving Problem

The above objects are attained by a solar cell sealing film which comprises a resin mixture of an ethylene-vinyl acetate copolymer and a polyethylene, and an organic peroxide wherein a mass ratio (EVA:PE) of the ethylene-vinyl acetate copolymer (EVA) to the polyethylene (PE) is 8:2 to 3:7 in the resin mixture, and wherein a melting point of the resin mixture (temperature at a viscosity of 30,000 Pa·s) is 80 to 105° C.

Advantageous Effects of Invention

According to the solar cell sealing film of the present invention, shrinkage of the sealing film is suppressed when heated in the process for adhesively combining each materials of the solar cell. Thus, photovoltaic elements are prevented from being cracked or overlapped and finally a well adhesively combined solar cell is obtained.

BRIEF DESCRIPTION OF DRAWINGS

FIG. 1 is a schematic cross sectional view showing a structure of a general solar cell.

DESCRIPTION OF EMBODIMENTS

Hereinafter, the present invention will be explained in details. As mentioned, the solar cell sealing film (occasionally abbreviated to the sealing film) of the present invention contains an organic peroxide and a resin mixture of an ethylene-vinyl acetate copolymer and a polyethylene.

In the resin mixture, the mass ratio (EVA:PE) of the ethylene-vinyl acetate copolymer (EVA) to the polyethylene (PE) is 8:2 to 3:7, preferably 6:4 to 3:7, more preferably 5.5:4.5 to 3:7. If EVA is more than and PE is less than the range, thermal shrinkage of the sealing film cannot be suppressed enough. If PE is more than and EVA is less than the range, the crosslinking reaction cannot be generated enough.

The melting point of the resin mixture of EVA and PE is preferably 80 to 105° C., more preferably 80 to 95° C. If the melting point is lower than the range, the thermal shrinkage becomes bigger. If the melting point is higher than the range, the organic peroxide may be decomposed in the film making process for the sealing film. Especially, the temperature of 95° C. or less is advantageous further since the film can be made by a film making apparatus having a general temperature controlling device (temperature control by using water). Here in the present invention, a melting point means a temperature when a target sample has a viscosity of 30,000 Pa·s and it is determined by following procedures. The viscosity is measured at every 1° C. increment under the condition of the test speed 1 mm/min by using a Viscometer Capilo-graph 1D (furnace body diameter: ϕ9.55 mm, capillary: ϕ1.0×10 mm, Toyo Seiki Co.), the temperature at the viscosity of 30,000 Pa·s is measured and thus the melting point is determined.

The content rate of vinyl acetate in the ethylene-vinyl acetate copolymer is preferably 10% by mass or more and less than 30% by mass, more preferably 20 to 26% by mass. If the content rate of vinyl acetate is less than 10% by mass, enough adhesiveness as the sealing film may not be obtained. If the content rate of vinyl acetate is more than 30% by mass, the melting point becomes lower and the thermal shrinkage degree may be severe. In the present invention, the content rate of vinyl acetate in EVA is a value measured by using a method described in JIS K 6924-1. It is preferable that the ethylene-vinyl acetate copolymer itself has the melting point of 60 to 90° C., more preferably 66 to 83° C.

The solar cell sealing film of the present invention can be produced by mixing and kneading a sealing film forming composition containing EVA, PE and organic peroxide, followed by forming it in a sheet shaped.

Further, it is advantageous that the solar cell sealing film of the present invention has a minimum torque $M_L$ of 0.04 N·m or less and a maximum torque $M_H$ of 0.4 N·m or more which are measured by an oscillation method vulcanizing test conforming to JIS K 6300-2 under the condition of 150° C. and 15 minutes. If the torque value, which indicates a cross-linking degree, is within the range above, the solar cell sealing film becomes one in which the crosslinking reaction can be generated enough.

Polyethylene contained in the resin mixture is, as defined by JIS, a polymer mainly containing ethylene and includes homopolymer of ethylene, copolymer of ethylene and 5 mol % or less of α-olefin having a carbon number of 3 or more (for example, butene-1, hexene-1,4-methylpentene-1 and octene-1), and a copolymer of ethylene and 1 mol % or less of non-olefin monomer having only carbon, oxygen and hydrogen atoms in a functional group(s) thereof (JIS K6922-1: 1997). In general, PE is classified based on the density thereof. High density polyethylene (HDPE), low density polyethylene (LDPE) and linear low density polyethylene (LLDPE) are indicated, for example.

LDPE has, in general, a long chain branch obtained by polymerizing ethylene in the presence of a radical generator such as organic peroxide under the high pressure 100 to 350 MPa and the density thereof is (confirming to JIS K7112, the same shall apply hereafter), in general, 0.910 g/cm$^3$ or more and less than 0.930 g/cm$^3$. LLDPE is, in general, obtained by copolymerizing ethylene and α-olefin in the presence of a transition metal catalyst such as a Ziegler-type catalyst, a Phillips catalyst and a metallocene-type catalyst and the density thereof is, in general, 0.910 to 0.940 g/cm$^3$, preferably 0.910 to 0.930 g/cm$^3$. HDPE is a polyethylene having, in general, the density of 0.942 to 0.970 g/cm$^3$.

Considering workability, the low density polyethylene or linear low density polyethylene is preferably used as the polyethylene in the present invention.

When using LDPE as polyethylene, it is preferable to use the LDPE having the melting point of 90 to 120° C. Further, it is also preferable to use the LDPE having the molecular weight distribution (Mn/Mw) of 4.0 or more. When using LLDPE as polyethylene, it is preferable to use the LLDPE having the melting point of 90 to 120° C. Further, it is also preferable to use LLDPE having the molecular weight distribution (Mn/Mw) of 3.0 or more.

Melt flow rates (MFR) of the above described ethylene-vinyl acetate copolymer and polyethylene are not specifically limited to and can be selected appropriately.

According to the present invention, even if a low melting point EVA which may increase shrinkage is contained, shrinkage of the sealing film at heating can be suppressed by containing polyethylene with the melting point higher than EVA at the mass ratio described above and by setting the melting point of the resin mixture in the higher range of 80 to 105° C. Furthermore, even though polyethylene with poor crosslinkability is contained, the mass ratio described above provides crosslinkability enough for adhesiveness with other material/element while lowering water vapor permeability, improving insulation performance and suppressing acid generation. As the result, the durability of the solar cell can be improved.

The solar cell sealing film of the present invention contains an organic peroxide. The content of the organic peroxide is 0.1 to 5 parts by mass, more preferably 1.0 to 2.0 parts by mass based on 100 parts by mass of the resin mixture. By containing the organic peroxide in the range above, it is possible to obtain the solar cell sealing film in which crosslinking reaction is generated enough.

The preferable organic peroxide has 90 to 120° C. of 10 hour half-life period temperature. The organic peroxide is, in general, selected by considering the melting point of the resin mixture, film forming temperature, preparing condition of the composition, curing temperature, heat resistance of the adherend and storage stability.

Examples of the organic peroxide, for example, include benzoyl peroxide curing agent, tert-hexyl peroxypivalate, tert-butyl peroxypivalate, 3,5,5-trimethylhexanoyl peroxide, di-n-octanoyl peroxide, lauroyl peroxide, stearoyl peroxide, 1,1,3,3-tetramethylbutylperoxy-2-ethyl hexanoate, succinic acid peroxide, 2,5-dimethyl-2,5-di(tert-butylperoxy)hexane, 2,5-dimethyl-2,5-di(2-ethylhexanoylperoxy)hexane, 1-cyclohexyl-1-methylethylperoxy-2-ethylhexanoate, tert-hexylperoxy-2-ethylhexanoate, 4-methylbenzoyl peroxide, tert-butylperoxy-2-ethyl hexanoate, m-toluoyl+benzoylperoxide, benzoyl peroxide, 1,1-bis(tert-butylperoxy)-2-methylcyclohexanoate, 1,1-bis(tert-hexylperoxy)-3,3,5-trimethylcyclohexanoate, 1,1-bis(tert-hexylperoxy)cyclohexanoate, 1,1-bis(tert-butylperoxy)-3,3,5-trimethylcyclohexane, 1,1-bis(tert-butylperoxy)cyclohexane, 2,2-bis(4,4-di-tert-butylperoxycyclohexyl)propane, 1,1-bis(tert-butylperoxy)cyclododecane, tert-hexylperoxyisopropyl monocarbonate, tert-butylperoxy maleic acid, tert-butylperoxy-3,3,5-trimethyl hexane, tert-butyl peroxylaurate, 2,5-dimethyl-2,5-di(methylbenzoylperoxy)hexane, tert-butylperoxyisopropyl monocarbonate, tert-butylperoxy-2-ethylhexyl monocarbonate, tert-hexyl peroxybenzoate, and 2,5-dimethyl-2,5-di(benzoylperoxy)hexane.

Examples of the benzoyl peroxide curing agent, for example, include benzoyl peroxide, 2,5-dimethylhexyl-2,5- bisperoxy benzoate, p-chlorobenzoyl peroxide, m-toluoyl peroxide, 2,4-dicyclobenzoyl peroxide, t-butylperoxy benzoate. The benzoyl peroxide-type cure agents can be employed singly or in combination of two or more kinds.

The particularly preferred organic peroxide is 2,5-dimethyl-2,5-di(tert-butylperoxy)hexane which bring about a solar cell sealing film in which bubbles are efficiently prevented from being generated.

The solar cell sealing film preferably contains crosslinking auxiliary agent. The crosslinking auxiliary agent enables increase of the crosslinking density and improvement of adhesive property, heat resistance and durability of the solar cell sealing film.

The crosslinking auxiliary agent can be used in the range of 0.1 to 3.0 parts by mass, preferably in the range of 0.1 to 2.5 parts by mass, based on 100 parts by mass of the resin mixture. Such content of the crosslinking auxiliary agent brings about an improvement of the crosslinking density without generating gas due to the addition of the crosslinking auxiliary agent Examples of the crosslinking auxiliary agents (compounds having a radical polymerizable group as a functional group) include tri-functional cross-linking auxiliary agents such as triallyl cyanurate and triallyl isocyanurate, and mono- or bi-functional crosslinking auxiliary agents of (meth)acryl esters (e.g., NK Ester, etc.). Among these compounds, triallyl cyanurate and triallyl isocyanurate are preferred, especially triallyl isocyanurate.

The solar cell sealing film preferably has excellent adhesion from the viewpoint of sealing performance within a solar cell. Therefore the sealing film preferably contains an adhesion improver further. As the adhesion improver, silane-coupling agents can be employed whereby a solar cell sealing film having excellent adhesion strength can be obtained. Examples of the silane-coupling agents include γ-chloropropylmethoxysilane, vinylethoxysilane, vinyltris(β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl) ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane. The silane-coupling agents can be used singly, or in combination of two or more kinds. Especially, γ-methacryloxypropyltrimethoxysilane is preferred.

The content of the silane coupling agent is preferably 5 parts by mass or less, particularly in the range of 0.1 to 2 parts by mass, based on 100 parts by mass of the resin mixture.

The solar cell sealing film of the present invention can further contain, if necessary, various additives such as plasticizers, acryloxy group-containing compounds, methacryloxy group-containing compounds and/or epoxy group-containing compounds, for improvement or adjustment of various properties of the film (e.g., mechanical strength, optical characteristics such as transparency, heat-resistance, light-resistance, or crosslinking rate, etc.), especially for improvement of mechanical strength.

Generally, polybasic acid esters and polyhydric alcohol esters can be used as the plasticizer, although there are not particular restrictions to plasticizer to be used. Examples of the plasticizers include dioctyl phthalate, dihexyl adipate, triethylene glycol-di-2-ethylbutyrate, butyl sebacate, tetraethylene glycol diheptanoate and triethylene glycol dipelargonate. The plasticizers can be used singly, or in combination of two or more kinds. The plasticizer is preferably contained in amount of 5 parts by mass or less based on 100 parts by mass of the resin mixture.

Generally, derivatives of acrylic acid or methacrylic acid such as esters and amides of acrylic acid or methacrylic acid can be used as the acryloxy group-containing compound and methacryloxy group-containing compound. Examples of the ester residue include linear alkyl groups (e.g., methyl, ethyl, dodecyl, stearyl and lauryl), cyclohexyl group, tetrahydrofurfuryl group, aminoethyl group, 2-hydroxyethyl group, 3-hydroxypropyl group, 3-chloro-2-hydroxypropyl group. Example of the amide includes diacetone acryl amide. Further, examples include esters of acrylic acid or methacrylic acid with polyhydric alcohol such as ethylene glycol, triethylene glycol, polypropylene glycol, polyethylene glycol, trimethylol propane or pentaerythritol.

Examples of the epoxy group-containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-t-butylphenyl glycidyl ether, diglycidyl adipate, diglycidyl phthalate, glycidyl methacrylate and butyl glycidyl ether.

The content of acryloxy group-containing compound, methacryloxy group-containing compound or epoxy group-containing compound is preferably in the range of 0.5 to 5.0 parts by mass in general, particularly in the range of 1.0 to 4.0 parts by mass, based on 100 parts by mass of the resin mixture respectively.

The solar cell sealing film of the invention may contains an aging inhibitor. Examples of the aging inhibitors include hindered phenol-type antioxidants such as N,N'-hexane-1,6-diyl-bis[3-(3,5-di-tert-butyl-4-hydroxyphenyl)propionamide], phosphorus-type heat stabilizers, lactone-type heat stabilizers, vitamin E-type heat stabilizers and sulfur-type heat stabilizers.

The solar cell sealing film of the invention can be prepared in accordance with heretofore known processes.

For example, the sealing film can be prepared by molding a composition including the above resin mixture and organic peroxide e.g. into a sheet-shaped product by usual extrusion-molding or calendar molding (calendaring). Additionally, the heat temperature for forming film is preferably a temperature that the crosslinker causes no reaction or little reactions. For instance, the temperature is preferably in the range of 80 to 105° C.

The thickness of the solar cell sealing film, though is not particularly restricted, preferably is in the range of 0.05 mm to 2.0 mm.

For sufficiently sealing photovoltaic elements in the solar cell, for instance, a light receiving side transparent protection material 11, a solar cell sealing film of the invention (a light receiving side sealing film) 13A, photovoltaic elements 14 such as crystalline silicon cells, a solar cell sealing film of the invention (backside sealing film) 13B and a backside protection material 12 are laminated in this order, as shown in FIG. 1. Thereafter, the sealing films are crosslinked and cured according to a conventional process such as the application of heating and pressure.

For example, the laminated body can be bonded under the application of heating and pressure by using a vacuum laminator under the condition of temperature of 135 to 180° C., preferably 140 to 180° C., especially 155 to 180° C., degassing time period of 0.1 min to 5 min, pressing pressure of 0.1 kg/cm$^2$ to 1.5 kg/cm$^2$ and pressing time period of 5 min to 15 min. By the heating and pressing, the resin of the resin mixture contained in the light receiving side sealing film 13A and back side sealing film 13B is crosslinked. Thus, the light receiving side transparent protection material 11, backside transparent material 12 and photovoltaic elements 14 are combined via the light receiving side sealing film 13A and backside sealing film 13B so that photovoltaic elements 14 can be sealed.

The light receiving side transparent protection material 11 preferably used in the solar cell of the invention is generally a glass substrate such as silicate glass. The thickness of the glass substrate is generally in the range of 0.1 mm to 10 mm, preferably 0.3 mm to 5 mm. The glass substrate can be chemically or thermally tempered.

The backside protection material 12 for use in the invention is preferably a plastic film such as polyethylene terephthalate (PET). The backside protection material 12 may be added with a white pigment whereby permeating sunlight can be reflected and enter into photovoltaic elements so that the power generation efficiency is improved. From the viewpoint of heat resistance and moisture resistance, a fluorinated polyethylene film or especially a film having structure of fluorinated polyethylene film/Al/fluorinated polyethylene film laminated in this order is preferred.

The structure of the solar cell of the invention is not particularly restricted. Examples of the structure include a structure that photovoltaic elements are sealed by disposing the solar cell sealing films between a light receiving side transparent protection material and a backside protection material and by combining them. In the invention, "light receiving side" corresponds to a side of the photovoltaic element irradiated with the light, whereas "backside" corresponds to the reverse side of the light receiving side of the photovoltaic elements.

The invention can be utilized for not only a solar cell using single-crystalline or polycrystalline silicon crystal type photovoltaic elements as shown in FIG. 1, but also thin-film solar cells such as a thin-film silicon type solar cell, a thin-film amorphous silicon type solar cell and a copper indium selenide (CIS) type solar cell. In such cases, examples of the structure thereof includes, for example, a structure made by forming a thin film photovoltaic element layer on a surface of a light receiving side transparent protection material such as a glass substrate, a polyimide substrate and a fluorine resin type transparent substrate by chemical vapor deposition, laminating a solar cell sealing film and a back side protection material on the thin film photovoltaic element layer, and adhesively binding them. Examples of the structure also includes a structure made by forming thin film photovoltaic elements on a surface of a backside protection material, laminating a solar cell sealing film and a light receiving side transparent protection material on the thin film photovoltaic elements, and adhesively binding them. Alternatively, examples of the structure includes a structure made by laminating a light receiving side transparent protection material, a light receiving side sealing film, thin film photovoltaic elements, a backside sealing film and a backside protection material in this order, and adhesively binding them.

The invention is explained in detail using the following Examples.

EXAMPLES

Each material of the formulation set forth in following tables was fed into a roll mill and was needed at the temperature as a higher of the melting points (° C.) of EVA or PE (that is, the melting point of PE). Thus, the solar cell sealing film composition was prepared. The solar cell sealing film composition was subjected to calendaring processing at the melting point of each composition and then cooled to produce the solar cell sealing film (0.5 mm).

1. Hot Water Shrinkage Rate

The solar cell sealing film made by above method was dipped in hot water at 85° C. for 60 seconds and then the shrinkage rate of the sealing film is measured. The hot water shrinkage rate was calculated as a shrinkage-length to a size before dipping by comparing a size after dipping and the size before dipping. A circle indicates a rate less than 25%, a triangular indicates a rate 25 to 30% and X indicates a rate more than 30%.

2. Crosslinking Characteristic

For the solar cell sealing film made by the method above, a torque value as an indicator of the crosslinking degree was measured by the oscillation method vulcanizing test conforming to JIS K6300-2, using "Curelastometer" (product name: type II, JSR Trading Co., Ltd.) under the condition of 150° C. for 15 minutes. Measured values were evaluated such that a circle means a case having the minimum torque $M_L$ of 0.04 N·m or less and maximum torque $M_H$ of 0.4 N·m or more, and X means other cases.

3. Electromotive Force Characteristic (Durability)

A laminate, in which a glass/the above solar cell sealing film/photovoltaic elements (single-crystalline silicon cells)/the above solar cell sealing film/a PET film were laminated in this order, was heated and pressed for 10 minutes at 150° C. by using a vacuum laminator. Thus, each member was integrally combined each other and a solar cell was obtained. A primary electromotive force and an electromotive force after passing 2000 hours of the solar cell were measured in a hot and humid condition (85° C., 85 RH %). A deterioration degree of the electromotive force after passing 2000 hours against to the primary electromotive force was calculated. A circle indicates a degree less than 5% and X indicates a degree 5% or more.

Results are shown in tables. Table 1 shows a case that LDPE was used as polyethylene and Table 2 shows a case that LLDPE was used as polyethylene.

"Melting point" is the melting point of the resin mixture of EVA and PE. For the melting point of the resin mixture, a viscosity of the resin mixture was measured at every 1° C. increment under the condition of the test speed 1 mm/min by using Viscometer Capilo-graph 1D (furnace body diameter: ϕ9.55 mm, capillary: ϕ1.0×10 mm, Toyo Seiki Co.), temperature at the viscosity of 30,000 Pa·s was measured and such temperature is treated as the melting point.

TABLE 1

| | | | EXAMPLE | | | | | | | | |
|---|---|---|---|---|---|---|---|---|---|---|---|
| | | | 1 | 2 | 3 | 4 | 5 | 6 | 7 | 8 | 9 |
| FORMULATION (parts by mass) | EVA | UE633 | — | — | — | — | — | 50 | — | 60 | — |
| | | UE634 | 50 | 80 | 50 | 60 | 30 | — | 50 | — | 70 |
| | | UE750 | — | — | — | — | — | — | — | — | — |
| | PE(LDPE) | Petrosen 360 | 50 | — | — | — | — | — | — | — | — |
| | | Petrosen 202 | — | 20 | 50 | 40 | 70 | 50 | — | 40 | 30 |
| | | Petrosen 342 | — | — | — | — | — | — | 50 | — | — |
| | | LW01 | — | — | — | — | — | — | — | — | — |
| | Organic peroxide | Perhexa 25B | 1.3 | 1.3 | 1.3 | 1.3 | 1.3 | 1.3 | 1.3 | 1.3 | 1.3 |

TABLE 1-continued

| | | | | | | | | | | | |
|---|---|---|---|---|---|---|---|---|---|---|---|
| | Crosslinking auxiliary agent | TAIC | 1.5 | 1.5 | 1.5 | 1.5 | 1.5 | 1.5 | 1.5 | 1.5 | 1.5 |
| | Silane coupling agent | KBM503 | 0.3 | 0.3 | 0.3 | 0.3 | 0.3 | 0.3 | 0.3 | 0.3 | 0.3 |
| CHARACTERISTIC EVALUATION | Melting point (° C.) | | 92 | 80 | 91 | 88 | 91 | 95 | 92 | 92 | 83 |
| | Film characteristic | Hot water shrinkage rate | ○ | ○ | ○ | ○ | ○ | ○ | ○ | ○ | ○ |
| | | Crosslinking characteristic | ○ | ○ | ○ | ○ | ○ | ○ | ○ | ○ | ○ |
| | Solar cell characteristic | Durability | ○ | ○ | ○ | ○ | ○ | ○ | ○ | ○ | ○ |
| | EVALUATION IN TOTAL | | ○ | ○ | ○ | ○ | ○ | ○ | ○ | ○ | ○ |

| | | | COMPARATIVE EXAMPLE | | | | | | |
|---|---|---|---|---|---|---|---|---|---|
| | | | 1 | 2 | 3 | 4 | 5 | 6 | 7 |
| FORMULATION (parts by mass) | EVA | UE633 | — | — | — | — | — | — | 50 |
| | | UE634 | 100 | 90 | 20 | — | 30 | — | — |
| | | UE750 | — | — | — | 70 | — | 60 | — |
| | PE(LDPE) | Petrosen 360 | — | — | — | — | — | — | — |
| | | Petrosen 202 | — | 10 | 80 | 30 | — | 40 | — |
| | | Petrosen 342 | — | — | — | — | — | — | — |
| | | LW01 | — | — | — | — | 70 | — | 50 |
| | Organic peroxide | Perhexa 25B | 1.3 | 1.3 | 1.3 | 1.3 | 1.3 | 1.3 | 1.3 |
| | Crosslinking auxiliary agent | TAIC | 1.5 | 1.5 | 1.5 | 1.5 | 1.5 | 1.5 | 1.5 |
| | Silane coupling agent | KBM503 | 0.3 | 0.3 | 0.3 | 0.3 | 0.3 | 0.3 | 0.3 |
| CHARACTERISTIC EVALUATION | Melting point (° C.) | | 76 | 77 | 102 | 76 | 114 | 72 | 106 |
| | Film characteristic | Hot water shrinkage rate | x | x | ○ | x | ○ | x | ○ |
| | | Crosslinking characteristic | ○ | ○ | Δ | ○ | x | ○ | x |
| | Solar cell characteristic | Durability | x | x | x | x | x | x | x |
| | EVALUATION IN TOTAL | | x | x | x | x | x | x | x |

NOTE:
UF633: Ethylene-vinyl acetate copolymer (vinyl acetate content rate 20% by mass, MFR 20 g/10 min, melting point 83° C.), manufactured by Tosoh corporation.
UE634: Ethylene-vinyl acetate copolymer (vinyl acetate content rate 26% by mass, MFR 4.3 g/10 min, melting point 76° C.), manufactured by Tosoh corporation.
UF750: Ethylene-vinyl acetate copolymer (vinyl acetate content rate 32% by mass, MFR 30 g/10 min, melting point 66° C.), manufactured by Tosoh corporation.
Petrosen 360: Low density polyethylene (MFR 1.6 g/10 min, melting point 108° C.), manufactured by Tosoh corporation.
Petrosen 202: Low density polyethylene (MFR 24 g/10 min, melting point 106° C.), manufactured by Tosoh corporation.
Petrosen 342: Low density polyethylene (MFR 8 g/10 min, melting point 107° C.), manufactured by Tosoh corporation.
LW 01: Low density polyethylene (MFR 4.3 g/10 min, melting point 128° C.), manufactured by Tosoh corporation.
Perhexa 25B: 2,5-dimethyl-2,5-di(t-butylperoxy)hexane (10 hour half-life period temperature is 118° C.), manufactured by Nihon Yushi corporation.
TAIC: triallyl isocyanurate, manufactured by Nippon Kasei Chemical Co., Ltd.
KBM503: γ-methacryloxypropyltrimethoxysilane, manufactured by Shin-Etsu Chemical Co., Ltd.

TABLE 2

| | | | EXAMPLE | | | | | | | | | COMPARATIVE EXAMPLE | | | |
|---|---|---|---|---|---|---|---|---|---|---|---|---|---|---|---|
| | | | 10 | 11 | 12 | 13 | 14 | 15 | 16 | 17 | 18 | 8 | 9 | 10 | 11 |
| FORMULATION (parts by mass) | EVA | UE633 | — | — | — | — | — | 50 | — | 60 | — | — | — | — | — |
| | | UE634 | 50 | 80 | 60 | 50 | 30 | — | 50 | — | 70 | 100 | 90 | 20 | 30 |
| | PE(LLDPE) | 7P06A | 50 | — | — | — | — | — | — | — | — | — | — | — | — |
| | | 1540F | — | 20 | 40 | 50 | 70 | 50 | — | 40 | 30 | — | 10 | 80 | — |
| | | UF230 | — | — | — | — | — | — | 50 | — | — | — | — | — | — |
| | | UJ790 | — | — | — | — | — | — | — | — | — | — | — | — | 70 |
| | Organic peroxide | Perhexa 25B | 1.3 | 1.3 | 1.3 | 1.3 | 1.3 | 1.3 | 1.3 | 1.3 | 1.3 | 1.3 | 1.3 | 1.3 | 1.3 |
| | Crosslinking auxiliary agent | TAIC | 1.5 | 1.5 | 1.5 | 1.5 | 1.5 | 1.5 | 1.5 | 1.5 | 1.5 | 1.5 | 1.5 | 1.5 | 1.5 |
| | Silane coupling agent | KBM503 | 0.3 | 0.3 | 0.3 | 0.3 | 0.3 | 0.3 | 0.3 | 0.3 | 0.3 | 0.3 | 0.3 | 0.3 | 0.3 |

TABLE 2-continued

|  |  |  | EXAMPLE |  |  |  |  |  |  |  |  | COMPARATIVE EXAMPLE |  |  |  |
|---|---|---|---|---|---|---|---|---|---|---|---|---|---|---|---|
|  |  |  | 10 | 11 | 12 | 13 | 14 | 15 | 16 | 17 | 18 | 8 | 9 | 10 | 11 |
| CHARACTERISTIC EVALUATION | Melting point (° C.) |  | 86 | 80 | 85 | 88 | 93 | 91 | 99 | 96 | 83 | 76 | 76 | 96 | 111 |
|  | Film characteristic | Hot water shrinkage rate | ○ | ○ | ○ | ○ | ○ | ○ | ○ | ○ | ○ | x | x | ○ | ○ |
|  |  | Crosslinking characteristic | ○ | ○ | ○ | ○ | ○ | ○ | ○ | ○ | ○ | ○ | ○ | x | x |
|  | Solar cell characteristic | Durability | ○ | ○ | ○ | ○ | ○ | ○ | ○ | ○ | ○ | x | x | ○ | x |
| EVALUATION IN TOTAL |  |  | ○ | ○ | ○ | ○ | ○ | ○ | ○ | ○ | ○ | x | x | x | x |

NOTE:
UF633: Ethylene-vinyl acetate copolymer (vinyl acetate content rate 20% by mass, MFR 20 g/10 min, melting point 83° C.), manufactured by Tosoh corporation.
UE634: Ethylene-vinyl acetate copolymer (vinyl acetate content rate 26% by mass, MFR 4.3 g/10 min, melting point 76° C.), manufactured by Tosoh corporation.
7P06A: Linear low density polyethylene (LLDPE obtained by polymerization with metallocene catalyst, MFR 4 g/10 min, melting point 95° C.), manufactured by Tosoh corporation.
1540F: Linear low density polyethylene (MFR 4 g/10 min, melting point 99° C.), manufactured by Ube Maruzen Polyethylene Co., Ltd.
UF230: Linear low density polyethylene (MFR 1 g/10 min, melting point 121° C.), manufactured by Japan Polyethylene Corporation.
UJ790: Linear low density polyethylene (MFR 50 g/10 min, melting point 124° C.), manufactured by Japan Polyethylene Corporation.
Perhexa 25B: 2,5-dimethyl-2,5-di(t-butylperoxy)hexane (10 hour half-life period temperature is 118° C.), manufactured by Nihon Yushi corporation.
TAIC: triallyl isocyanurate, manufactured by Nippon Kasei Chemical Co., Ltd.
KBM503: γ-methacryloxypropyltrimethoxysilane, manufactured by Shin-Etsu Chemical Co., Ltd.

[Evaluation Result]

When the mass ratio of EVA to PF is out of the range of 8:2 to 3:7, it was confirmed that the hot water shrinkage ratio or crosslinking characteristic was deteriorated. It was also confirmed that the hot water shrinkage ratio become bigger when the melting point is less than 80° C. and the crosslinking characteristic and durability becomes lower when the melting point is more than 105° C.

REFERENCE SIGNS LIST

11: light receiving side transparent protection material
12: backside protection material
13A: light receiving side sealing film
13B: backside sealing film
14: photovoltaic element
15: connecting tab

What is claimed is:

1. A solar cell sealing film comprising,
a resin mixture of an ethylene-vinyl acetate copolymer and a polyethylene, and an organic peroxide,
wherein a mass ratio (EVA:PE) of the ethylene-vinyl acetate copolymer (EVA) to the polyethylene (PE) in the resin mixture is 8:2 to 3:7,
wherein a melting point of the resin mixture, which is a temperature at a viscosity of 30,000 Pa·s, is 80 to 105° C., and
wherein the polyethylene is a low density polyethylene (LDPE) having a density of 0.910 g/cm$^3$ or more and less than 0.930 g/cm$^3$, or a liner low density polyethylene (LLDPE) having density of 0.910 g/cm$^3$ to 0.940 g/cm$^3$.

2. The solar cell sealing film according to claim 1, wherein a content rate of vinyl acetate in the ethylene-vinyl acetate copolymer is 10% by mass or more and less than 30% by mass.

3. The solar cell sealing film according to claim 1, wherein a melting point of the resin mixture is 80 to 95° C.

4. The solar cell sealing film according to claim 1, wherein the mass ratio (EVA:PE) is 6:4 to 3:7.

5. The solar cell sealing film according to claim 1, wherein a minimum torque ML is 0.04 N·m or less and a maximum torque MH is 0.4 N·m or more as measured by an oscillation method vulcanizing test conforming to JIS K 6300-2 under a condition of 150° C. and 15 minutes.

6. A solar cell comprising a photovoltaic element sealed by a solar cell sealing film according to claim 1.

* * * * *